US012795960B2

(12) United States Patent
Park et al.

(10) Patent No.: US 12,795,960 B2
(45) Date of Patent: Nov. 10, 2026

(54) SEMICONDUCTOR DEVICE

(71) Applicant: SAMSUNG ELECTRONICS CO., LTD., Suwon-si (KR)

(72) Inventors: Jungmin Park, Seoul (KR); Hanjin Lim, Seoul (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 582 days.

(21) Appl. No.: 18/052,562

(22) Filed: Nov. 3, 2022

(65) Prior Publication Data

US 2023/0290811 A1 Sep. 14, 2023

(30) Foreign Application Priority Data

Mar. 11, 2022 (KR) ........................ 10-2022-0030540

(51) Int. Cl.
*H10D 1/68* (2025.01)
*H10B 53/30* (2023.01)

(52) U.S. Cl.
CPC ............. *H10D 1/684* (2025.01); *H10D 1/692* (2025.01)

(58) Field of Classification Search
CPC ........ H10D 1/684; H10D 1/682; H10D 1/692; H10D 1/68; H10B 53/30; H10B 12/30; H10N 70/821; H10N 70/023; H10N 70/041; H10N 70/063; H10N 70/24; H10N 70/25; H10N 70/826; H10P 30/20; H10P 36/00
See application file for complete search history.

(56) References Cited

U.S. PATENT DOCUMENTS 7,960,216 B2 * 6/2011 Phatak ................. H10N 70/026 257/4
11,164,976 B2 11/2021 Ramamoorthy et al.
2010/0243983 A1 * 9/2010 Chiang .............. G11C 13/0007 257/E47.001
2012/0127629 A1 * 5/2012 Roeder ................... C04B 35/49 428/641
2013/0071988 A1 * 3/2013 Deweerd ................ H10B 12/03 438/396
2014/0167221 A1 * 6/2014 Rui .......................... H10D 1/68 257/532
2020/0286884 A1 9/2020 Chang et al.
2020/0286985 A1 9/2020 Um et al.
2021/0242304 A1 8/2021 Un et al.
2021/0305398 A1 9/2021 Chang et al.
2021/0328004 A1 10/2021 Lee et al.
(Continued)

FOREIGN PATENT DOCUMENTS

KR 10-2020-0115693 A 10/2020
KR 10-2021-0142356 A 11/2021
SG 2202048 4/2022

*Primary Examiner* — Omar F Mojaddedi
(74) *Attorney, Agent, or Firm* — Morgan, Lewis & Bockius LLP

(57) ABSTRACT

A semiconductor device includes a capacitor structure. The capacitor structure includes a bottom electrode, a dielectric layer, and a top electrode that are stacked in a first direction. The dielectric layer includes a first dielectric layer, a second dielectric layer stacked on the first dielectric layer in the first direction, and a first impurity provided in the first dielectric layer. The first dielectric layer includes a ferroelectric material, and the second dielectric layer includes an anti-ferroelectric material.

19 Claims, 14 Drawing Sheets

(56) References Cited

U.S. PATENT DOCUMENTS

| | | | | |
|---|---|---|---|---|
| 2021/0359082 | A1 | 11/2021 | Kang | |
| 2023/0170381 | A1* | 6/2023 | Koo | H10D 1/684<br>257/295 |

* cited by examiner

SEMICONDUCTOR DEVICE

CROSS-REFERENCE TO RELATED APPLICATIONS

This U.S. non-provisional patent application claims priority under 35 U.S.C. § 119 from Korean Patent Application No. 10-2022-0030540, filed on Mar. 11, 2022 in the Korean Intellectual Property Office, the contents of which are herein incorporated by reference in their entirety.

TECHNICAL FIELD

Embodiments of the present disclosure are directed to a semiconductor device, and in particular, to a semiconductor memory device.

DISCUSSION OF THE RELATED ART

Semiconductor devices are classified as semiconductor memory devices that store data, semiconductor logic devices that process data, and a hybrid semiconductor devices that include both of memory and logic elements.

As integration densities of semiconductor devices increase, a capacitor is needed that has a sufficiently high capacitance in a limited area. The electrostatic capacitance of a capacitor is proportional to a surface area of an electrode and a dielectric constant of a dielectric layer, and is inversely proportional to an equivalent oxide thickness of the dielectric layer.

SUMMARY

An embodiment of the inventive concept provides a semiconductor device that includes a capacitor structure with an increased electrostatic capacitance.

According to an embodiment of the inventive concept, a semiconductor device includes a capacitor structure. The capacitor structure includes a bottom electrode, a dielectric layer, and a top electrode that are stacked in a first direction. The dielectric layer includes a first dielectric layer, a second dielectric layer stacked on the first dielectric layer in the first direction, and a first impurity provided in the first dielectric layer. The first dielectric layer includes a ferroelectric material, and the second dielectric layer includes an anti-ferroelectric material.

According to an embodiment of the inventive concept, a semiconductor device includes a capacitor structure. The capacitor structure includes a bottom electrode, a dielectric layer, and a top electrode that are sequentially stacked in a first direction. The dielectric layer includes a first dielectric layer, a second dielectric layer stacked on the first dielectric layer in the first direction, and a first impurity provided in the first dielectric layer. The first dielectric layer is in contact with the bottom or top electrode.

According to an embodiment of the inventive concept, a semiconductor device includes a substrate, bottom electrodes disposed on the substrate and that are horizontally spaced apart from each other, a top electrode that covers the bottom electrodes, and a dielectric layer interposed between each of the bottom electrodes and the top electrode. The dielectric layer includes a first dielectric layer, a second dielectric layer stacked on the first dielectric layer in a direction perpendicular to an interface between each of the bottom electrodes and the top electrode, and a first impurity provided in the first dielectric layer. The first dielectric layer includes a ferroelectric material, and the second dielectric layer includes an anti-ferroelectric material.

DETAILED DESCRIPTION

Embodiments of the inventive concepts will now be described more fully with reference to the accompanying drawings, in which embodiments are shown.

Figure 1:
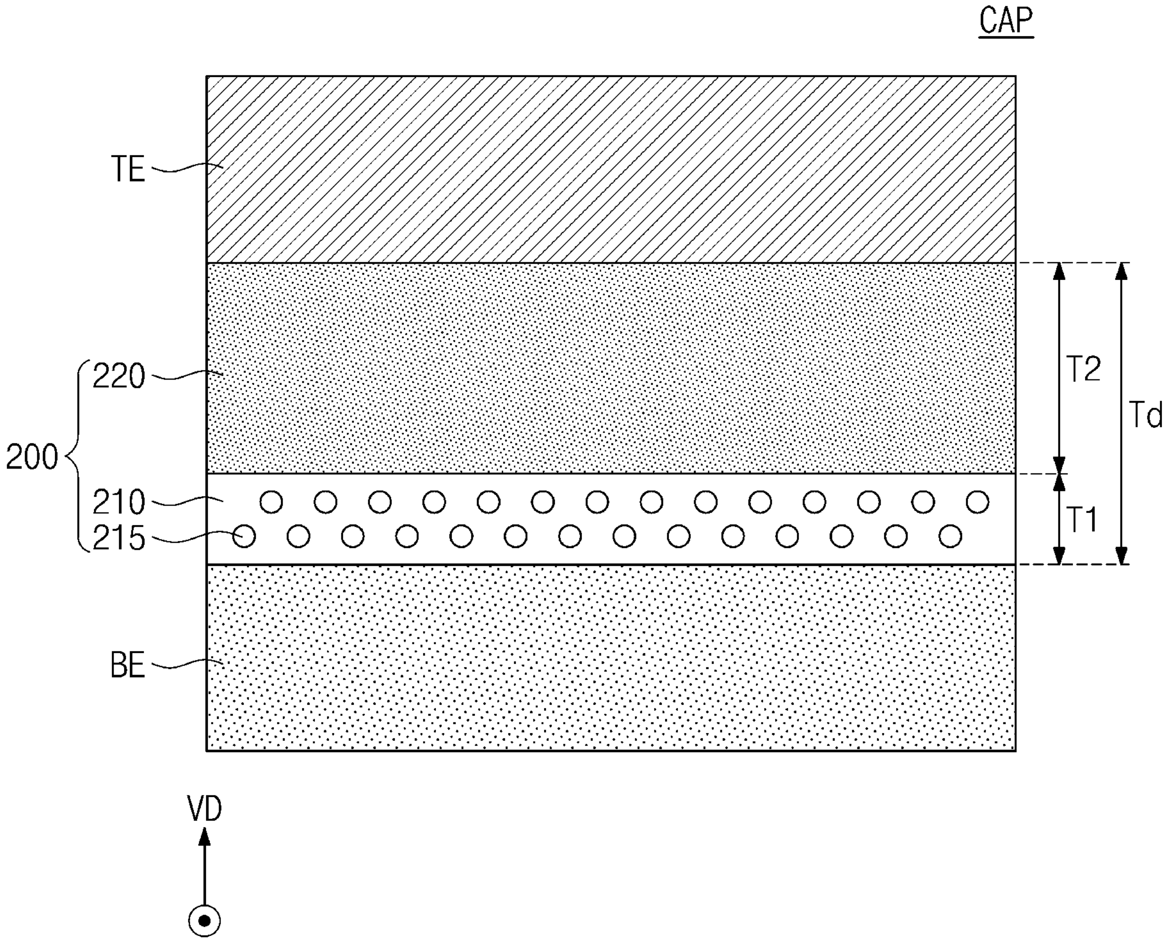
FIG. 1 is a sectional view of a capacitor structure of a semiconductor device according to an embodiment of the inventive concept.

FIG. 1 is a sectional view of a capacitor structure CAP of a semiconductor device according to an embodiment of the inventive concept.

Referring to FIG. 1, in an embodiment, a semiconductor device includes the capacitor structure CAP, and the capacitor structure CAP include a bottom electrode BE, a dielectric layer 200, and a top electrode TE that are sequentially stacked in a first direction VD. The first direction VD is perpendicular to an interface between the bottom electrode BE and the top electrode TE, and the dielectric layer 200 is interposed between the bottom electrode BE and the top electrode TE.

The dielectric layer 200 includes a first dielectric layer 210 that is provided between the bottom electrode BE and the top electrode TE, and a second dielectric layer 220 that is provided between the bottom electrode BE and the top electrode TE and is stacked on the first dielectric layer 210 in the first direction VD. In an embodiment, as shown in FIG. 1, the first dielectric layer 210 is interposed between the bottom electrode BE and the second dielectric layer 220, the second dielectric layer 220 is interposed between the first dielectric layer 210 and the top electrode TE, but embodiments of the inventive concept are not necessarily limited to this example. In an embodiment, the first dielectric layer 210 is in contact with the bottom electrode BE, as shown in FIG. 1, but embodiments of the inventive concept are not necessarily limited to this example.

The first dielectric layer 210 is formed of or includes a ferroelectric material. In an embodiment, the first dielectric layer 210 is formed of or includes at least one of hafnium oxide (e.g., $HfO_2$) or hafnium-zirconium oxide (e.g., $Hf_{0.5}Zr_{0.5}O_2$), but embodiments of the inventive concept are not necessarily limited to such materials. The second dielectric layer 220 is formed of or includes an anti-ferroelectric material or a material that has an electric field-induced phase transition property. In an embodiment, the second dielectric layer 220 is formed of or includes at least one of zirconium oxide (e.g., $ZrO_2$) or hafnium-zirconium oxide (e.g., $HfZrO_2$), but embodiments of the inventive concept are not necessarily limited to such materials. The dielectric layer 200 is formed of or includes at least one of hafnium oxide (e.g., $HfO_2$), zirconium oxide (e.g., $ZrO_2$), titanium oxide (e.g., $TiO_2$), tantalum oxide (e.g., $Ta_2O_3$), vanadium oxide (e.g., $VO_2$), aluminum oxide (e.g., $AlO_2$), silicon oxide (e.g., $SiO_2$), or hafnium-zirconium oxide (e.g., $HfZrO_2$), but embodiments of the inventive concept are not necessarily limited to such materials.

The dielectric layer 200 and the first and second dielectric layers 210 and 220 have thicknesses Td, T1, and T2, respectively, in the first direction VD. The thickness T1 of the first dielectric layer 210 differs from the thickness T2 of the second dielectric layer 220. The thickness T1 of the first dielectric layer 210 is less than the thickness T2 of the second dielectric layer 220. In an embodiment, the thickness T1 of the first dielectric layer 210 has a non-vanishing value that is less than or equal to 30% of the total thickness Td of the dielectric layer 200, and the thickness T2 of the second dielectric layer 220 is greater than or equal to 70% of the total thickness Td and less than of the total thickness Td. In an embodiment, the total thickness Td of the dielectric layer 200 is greater than 0 Å and less than or equal to 60 Å. In an embodiment, the thickness T1 of the first dielectric layer 210 is greater larger than 0 Å and less than or equal to 10 Å.

The dielectric layer 200 further includes a first impurity 215 that is contained in the first dielectric layer 210. In an embodiment, the first impurity 215 is provided in a ferroelectric material. The first impurity 215 includes a trivalent cation material. In an embodiment, the first impurity 215 includes at least one of $Y^{3+}$, $La^{3+}$ or $Al^{3+}$.

The bottom electrode BE is formed of or includes at least one conductive material. In an embodiment, the bottom electrode BE is formed of or includes at least one of silicon (Si), a metal, such as cobalt, titanium, nickel, tungsten, or molybdenum, a metal nitride, such as titanium nitride (e.g., TiN), titanium silicon nitride (e.g., TiSiN), titanium aluminum nitride (e.g., TiAlN), tantalum nitride (e.g., TaN, TaAlN), or tungsten nitride (e.g., WN), a precious metal, such as platinum (Pt), ruthenium (Ru) or iridium (Ir), a conductive oxide, such as PtO, $RuO_2$, $IrO_2$, SRO ($SrRuO_3$), BSRO ($(Ba,Sr)RuO_3$), CRO ($CaRuO_3$), or LSCo, or a metal silicide. The top electrode TE is formed of or includes at least one of titanium nitride, doped polysilicon, or doped silicon germanium. The top electrode TE may have a single- or multi-layered structure.

In an embodiment, the bottom electrode BE, the dielectric layer 200, and the top electrode TE are deposited by a chemical vapor deposition method or a physical vapor deposition method. In an embodiment, a deposition temperature of the bottom and top electrodes BE and TE ranges from 450° C. to 700° C., and a deposition temperature of the dielectric layer 200, such as the first and second dielectric layers 210 and 220, is lower than about 400° C. An annealing process is performed on the dielectric layer 200, and a temperature of the annealing process may range from 200° C. to 700° C.

According to an embodiment of the inventive concept, the dielectric layer 200 includes the first impurity 215 provided in the first dielectric layer 210. When an electric field is applied to the dielectric layer 200, which includes the ferroelectric material in the first dielectric layer 210 and the anti-ferroelectric material in the second dielectric layer 220, due to the presence of the first impurity 215, dipoles align in the dielectric layer 200. Accordingly, the dielectric layer 200 has an increased dielectric constant, and as a result, an electrostatic capacitance of the capacitor structure CAP increases.

FIGS. 2 to 7 are sectional views of the capacitor structure CAP of a semiconductor device according to an embodiment of the inventive concept. For concise description, an element previously described with reference to FIG. 1 may be identified by the same reference number without repeating an overlapping description thereof.

Figure 2:
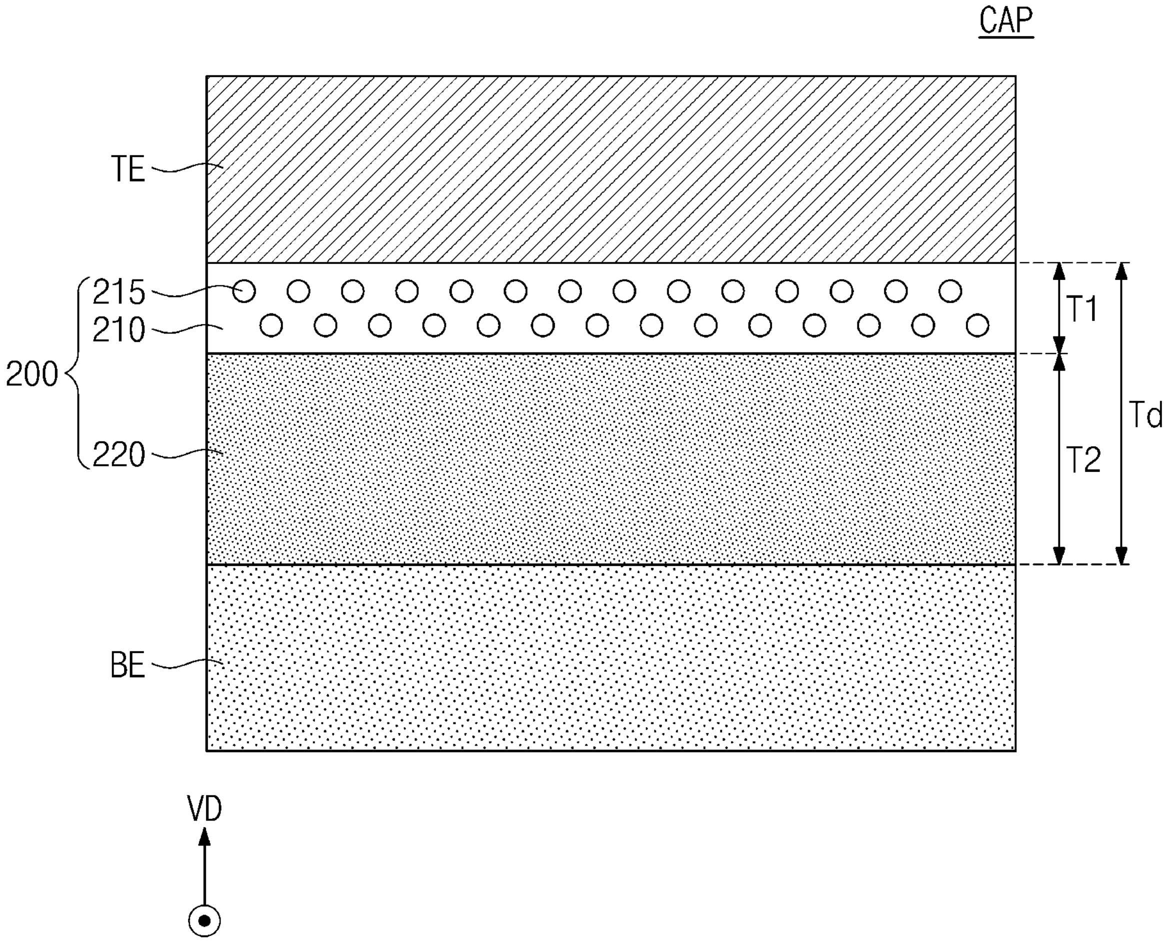
FIGS. 2 to 7 are sectional views of a capacitor structure of a semiconductor device according to an embodiment of the inventive concept.
Figure 3:
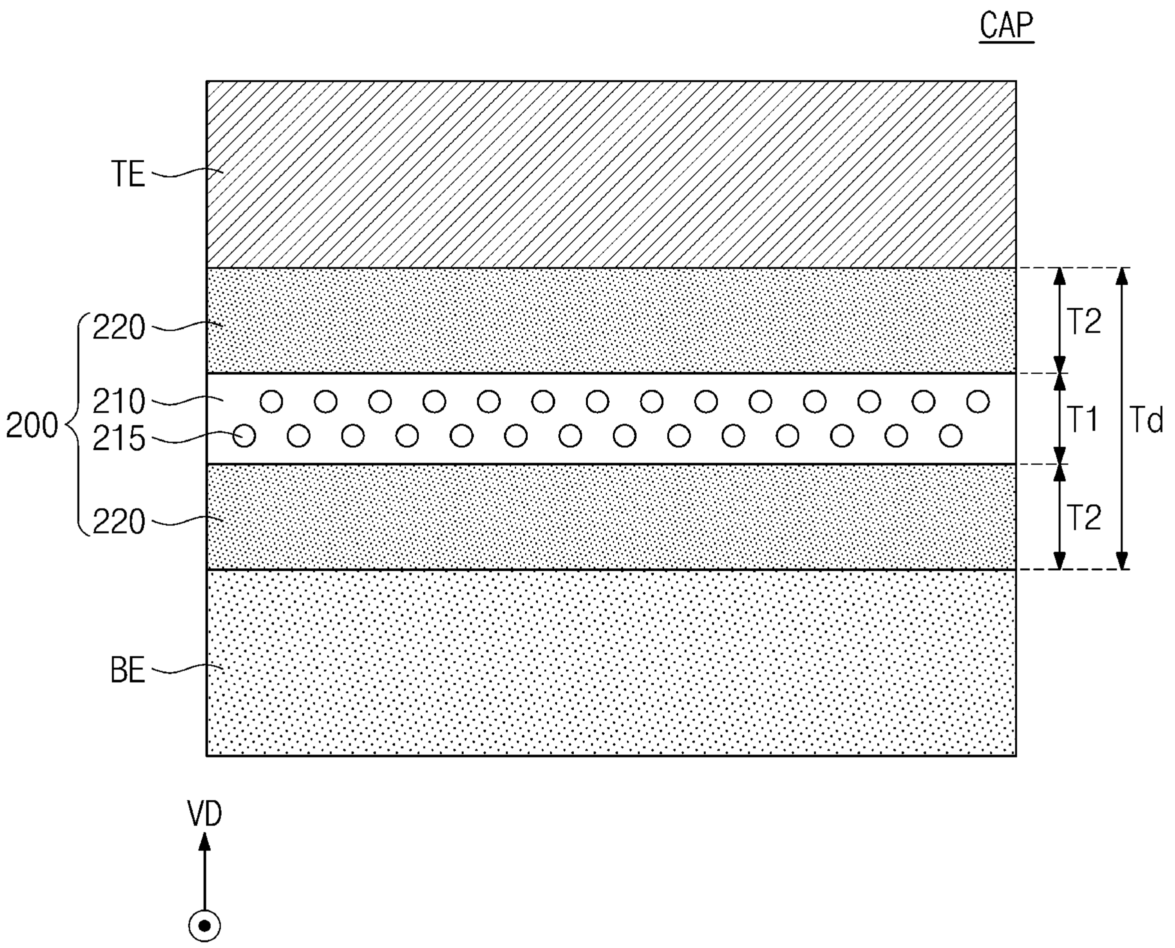

Referring to FIGS. 2 and 3, in some embodiments, the first and second dielectric layers 210 and 220 of the dielectric layer 200 are stacked in the first direction VD between the bottom electrode BE and the top electrode TE. The dielectric layer 200 includes the first impurity 215 in the first dielectric layer 210.

In an embodiment, as shown in FIG. 2, the first dielectric layer 210 is interposed between the top electrode TE and the second dielectric layer 220, and the second dielectric layer 220 is interposed between the bottom electrode BE and the first dielectric layer 210, but embodiments of the inventive concept are not necessarily limited to this example. In an embodiment, as shown in FIG. 2, the first dielectric layer 210 is in contact with the top electrode TE, but embodiments of the inventive concept are not necessarily limited to this example.

In an embodiment, as shown in FIG. 3, a plurality of second dielectric layers 220 are provided, and the first dielectric layer 210 is interposed between two second dielectric layers 220 that are adjacent to each other in the first direction VD. At least one of the second dielectric layers 220 is interposed between the bottom electrode BE and the first dielectric layer 210, and the other second dielectric layers 220 are interposed between the top electrode TE and the first dielectric layer 210.

In an embodiment, a plurality of first dielectric layers 210 are provided, and the second dielectric layer 220 may be interposed between two first dielectric layers 210 that are adjacent to each other in the first direction VD. At least one of the first dielectric layers 210 is interposed between the bottom electrode BE and the second dielectric layer 220, and the other first dielectric layers 210 are interposed between the top electrode TE and the second dielectric layer 220. The lowermost first dielectric layer 210 is in contact with the bottom electrode BE, and the uppermost first dielectric layers 210 is in contact with the top electrode TE.

Figure 4:
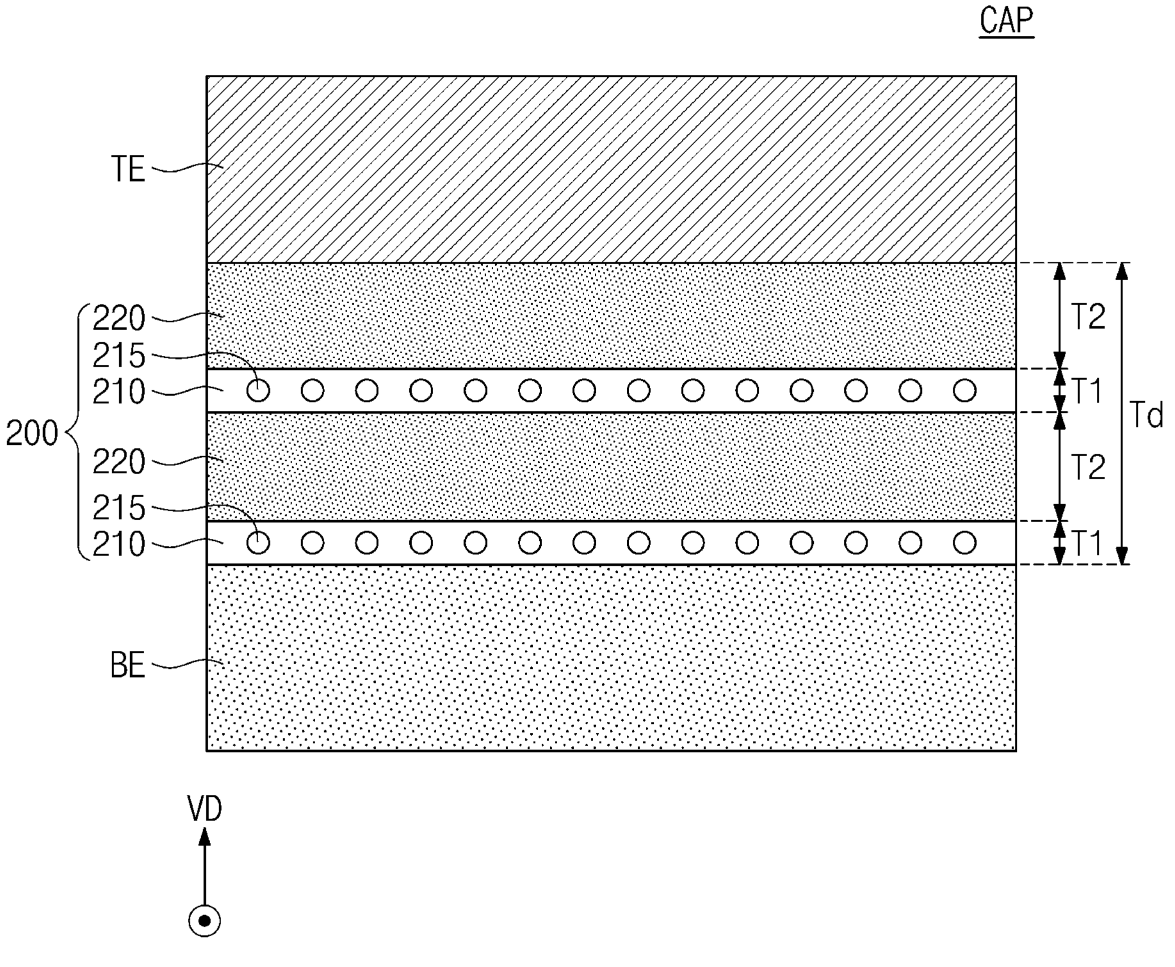
Figure 5:
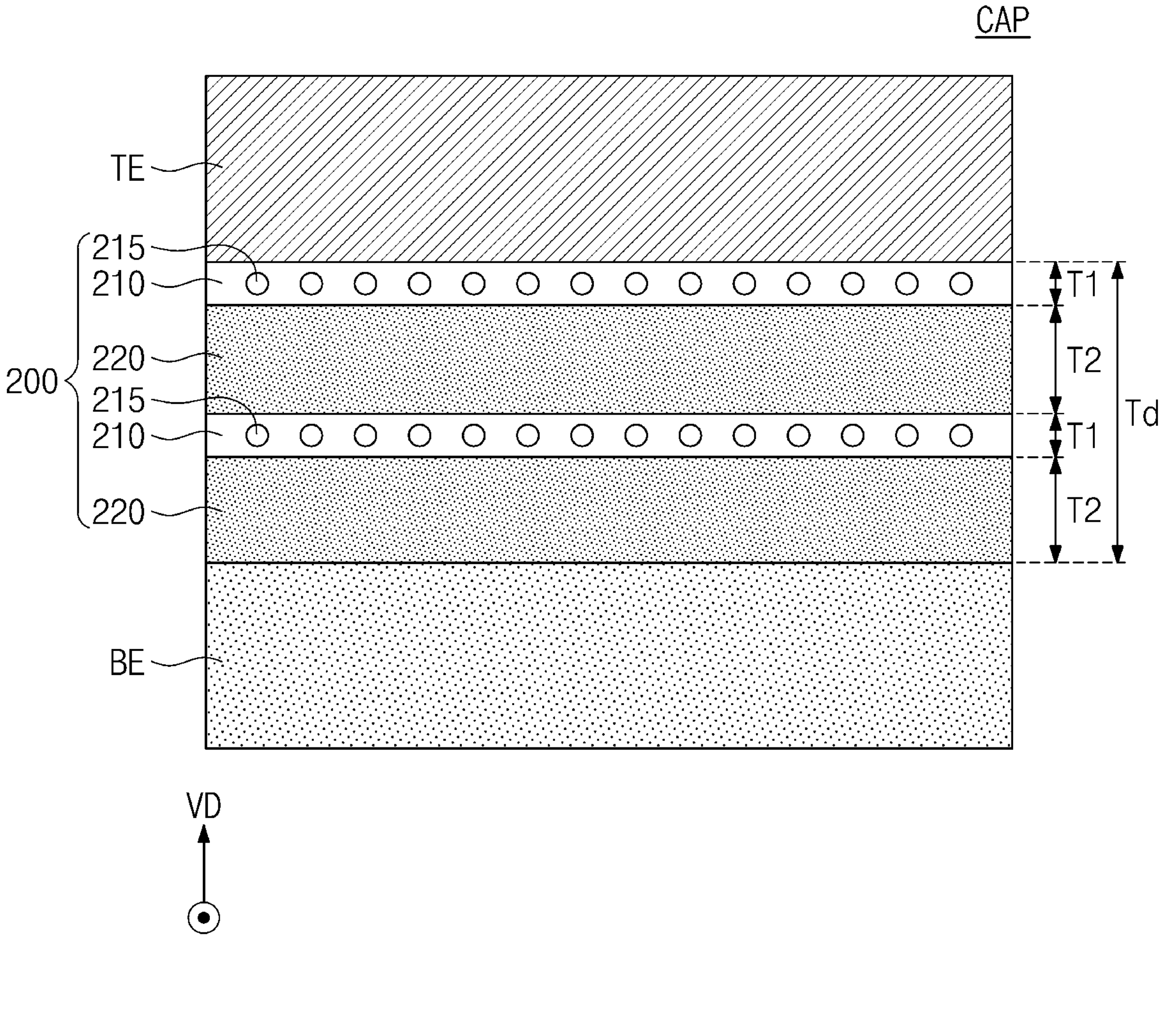

Referring to FIGS. 4 and 5, in some embodiments, the dielectric layer 200 includes a plurality of first dielectric layers 210 and a plurality of second dielectric layers 220. The dielectric layer 200 is provided between the bottom electrode BE and the top electrode TE, and the first and second dielectric layers 210 and 220 are alternately stacked in the first direction VD between the bottom electrode BE and the top electrode TE. In an embodiment, as shown in FIGS. 4 and 5, the first and second dielectric layers 210 and 220 include two first dielectric layers 210 and two second dielectric layers 220. However, embodiments of the inventive concept are not necessarily limited to this example, and in other embodiments, the first and second dielectric layers 210 and 220 include three or more first dielectric layers 210 and three or more second dielectric layers 220. The number of the first dielectric layers 210 may be equal to or different from the number of the second dielectric layers 220.

Each of the first dielectric layers 210 has a thickness T1 in the first direction VD, and each of the second dielectric layers 220 may has a thickness T2 in the first direction VD. The thicknesses T1 of the first dielectric layers 210 may be the same as or different from each other, and the thicknesses T2 of the second dielectric layers 220 may be the same as or different from each other. A sum of the thicknesses T1 of the first dielectric layers 210 is less than a sum of the thicknesses T2 of the second dielectric layers 220. In an embodiment, the sum of the thicknesses T1 of the first dielectric layers 210 has a non-vanishing value that is less than or equal to 30% of the total thickness Td of the dielectric layer 200, and the sum of the thicknesses T2 of the second dielectric layers 220 is greater than or equal to 70% of the total thickness Td and less than the total thickness Td. In an embodiment, the total thickness Td of the dielectric layer 200 is greater than 0 Å and less than or equal to 60 Å. In an embodiment, the thickness T1 of each of the first dielectric layers 210 is greater than 0 Å and less than or equal to 10 Å.

In an embodiment, as shown in FIG. 4, the lowermost first dielectric layer 210 is interposed between the lowermost second dielectric layer 220 and the bottom electrode BE. The lowermost first dielectric layer 210 is in contact with the bottom electrode BE. The uppermost second dielectric layer 220 is interposed between the uppermost first dielectric layer 210 and the top electrode TE.

In an embodiment, as shown in FIG. 5, the uppermost first dielectric layer 210 is interposed between the uppermost second dielectric layer 220 and the top electrode TE. The uppermost first dielectric layer 210 is in contact with the top electrode TE. The lowermost second dielectric layer 220 is interposed between the lowermost first dielectric layer 210 and the bottom electrode BE.

In an embodiment, the lowermost first dielectric layer 210 is interposed between the lowermost second dielectric layer 220 and the bottom electrode BE. In addition, the uppermost first dielectric layer 210 is interposed between the uppermost second dielectric layer 220 and the top electrode TE. The lowermost first dielectric layer 210 is in contact with the bottom electrode BE, and the uppermost first dielectric layer 210 is in contact with the top electrode TE.

The dielectric layer 200 further includes the first impurity 215. The first impurity 215 is provided in at least one of the first dielectric layers 210. In an embodiment, as shown in FIGS. 4 and 5, the first impurity 215 is provided in each of the first dielectric layers 210. However, embodiments of the inventive concept are not necessarily limited to this example, and in an embodiment, the first impurity 215 is provided in some, but not all, of the first dielectric layers 210.

Figure 6:
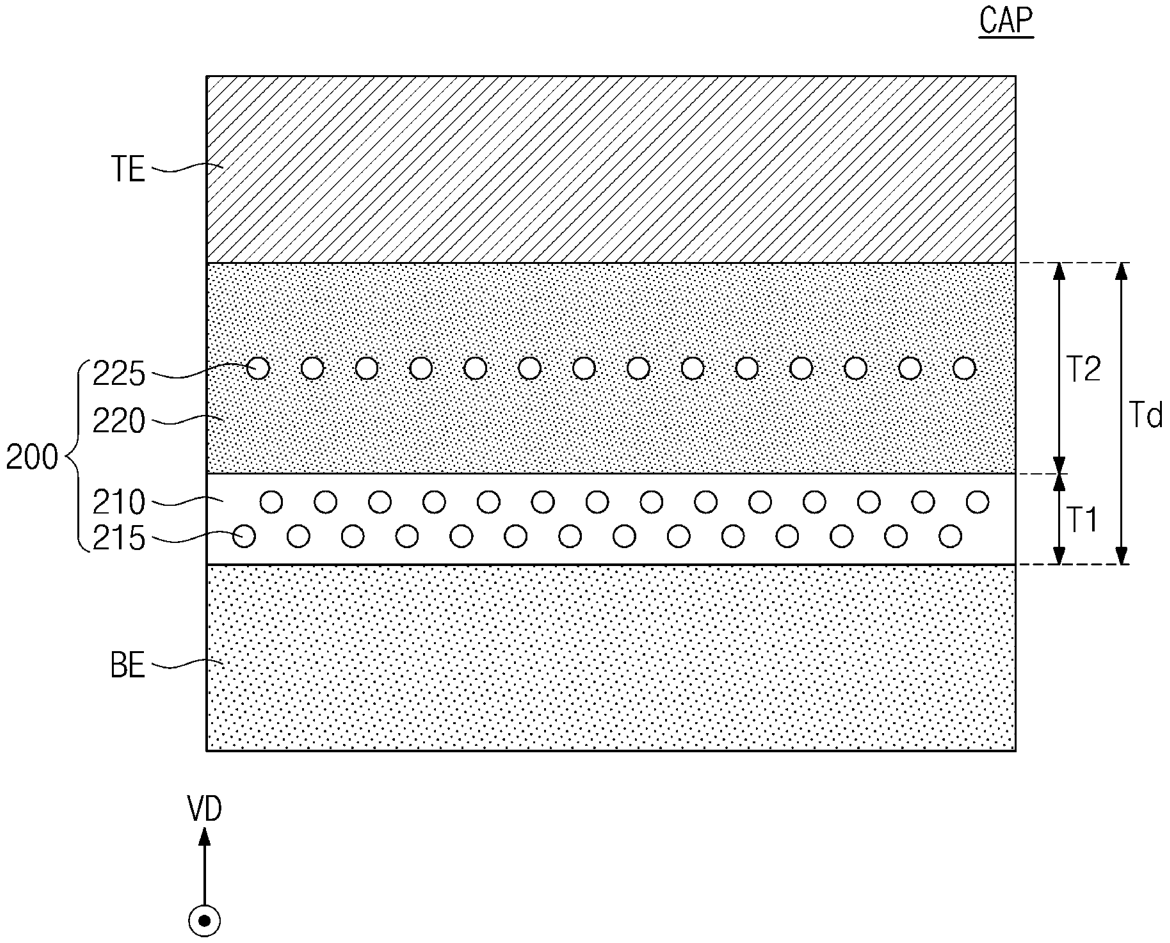

Referring to FIG. 6, in an embodiment, the dielectric layer 200 includes a second impurity 225. The second impurity 225 is doped in the second dielectric layer 220 of the dielectric layer 200. The doping of the second impurity 225 is performed such that the second impurity 225 is located in the second dielectric layer 220 at a specific height in the first direction VD. For example, when measured in the first direction VD, the second impurity 225 in the second dielectric layer 220 is located near a height that corresponds to half of a total height of the dielectric layer 200, but embodiments of the inventive concept are not necessarily limited to this example. The second impurity 225 includes at least one material that has a band gap greater than or equal to 5 eV. In an embodiment, the second impurity 225 includes at least one of aluminum oxide (e.g., $Al_2O_3$), silicon oxide (e.g., $SiO_2$), beryllium oxide (e.g., $BeO_2$), or molybdenum oxide (e.g., $MoO_2$). In addition, when a plurality of second dielectric layers 220 are provided, the second impurity 225 is doped in at least one of the second dielectric layers 220.

Figure 7:
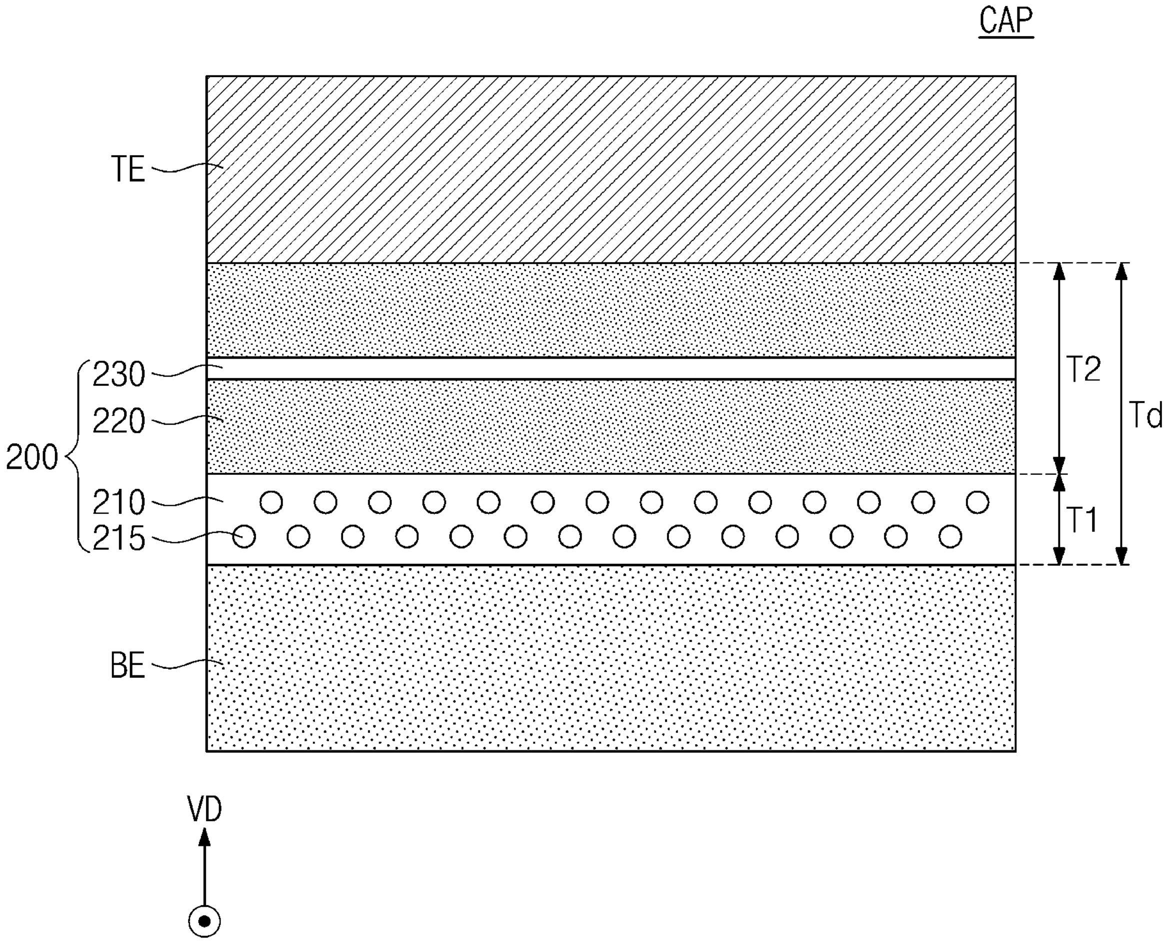

Referring to FIG. 7, in an embodiment, the dielectric layer 200 includes a third dielectric layer 230. The third dielectric layer 230 is interposed between two second dielectric layers 220 that are adjacent to each other in the first direction VD. The third dielectric layer 230 includes at least one material that has a band gap greater than 5 eV. In an embodiment, the third dielectric layer 230 is formed of or includes at least one of aluminum oxide (e.g., $Al_2O_3$), silicon oxide (e.g., $SiO_2$), beryllium oxide (e.g., $BeO_2$), or molybdenum oxide (e.g., $MoO_2$).

Figure 8:
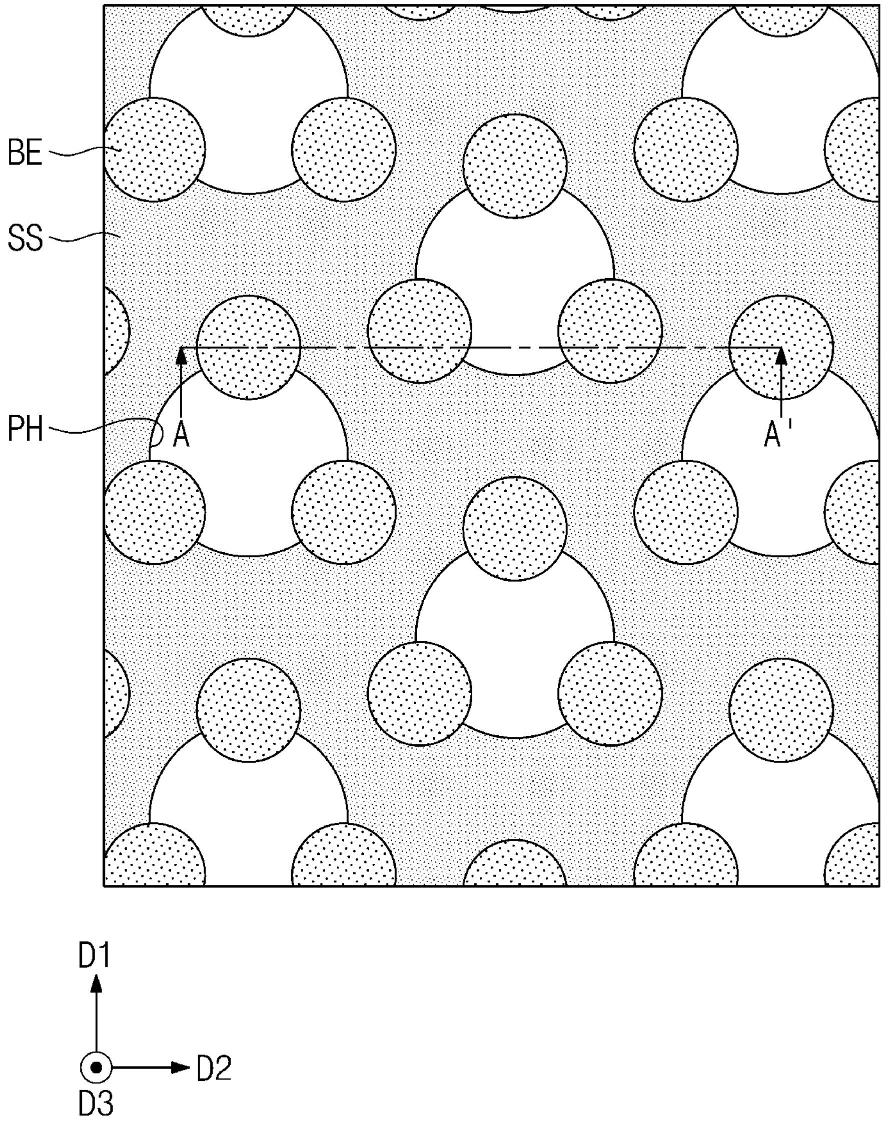
FIG. 8 is a plan view of a semiconductor device according to an embodiment of the inventive concept.
Figure 9:
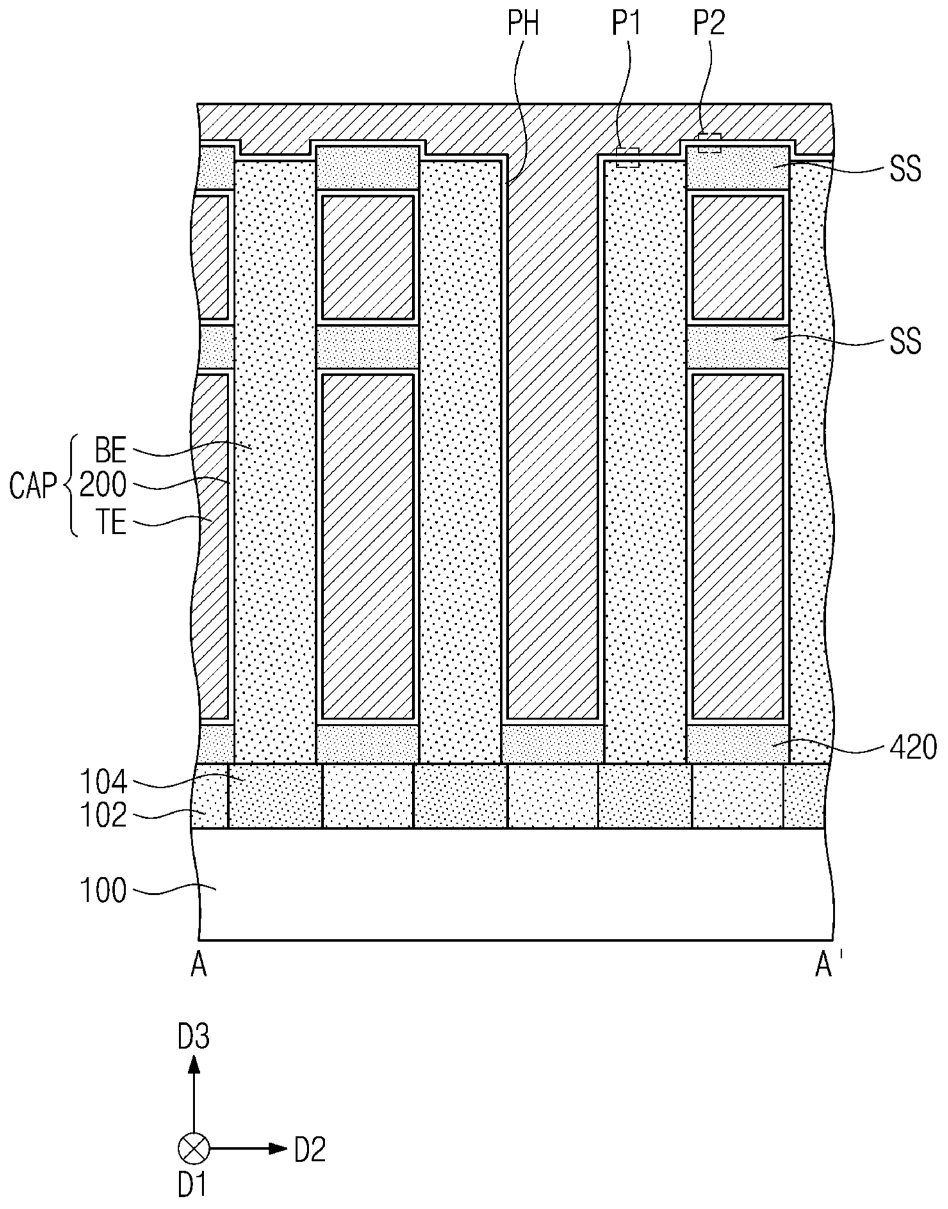
FIG. 9 is a sectional view taken along a line A-A' of FIG. 8.
Figure 10:
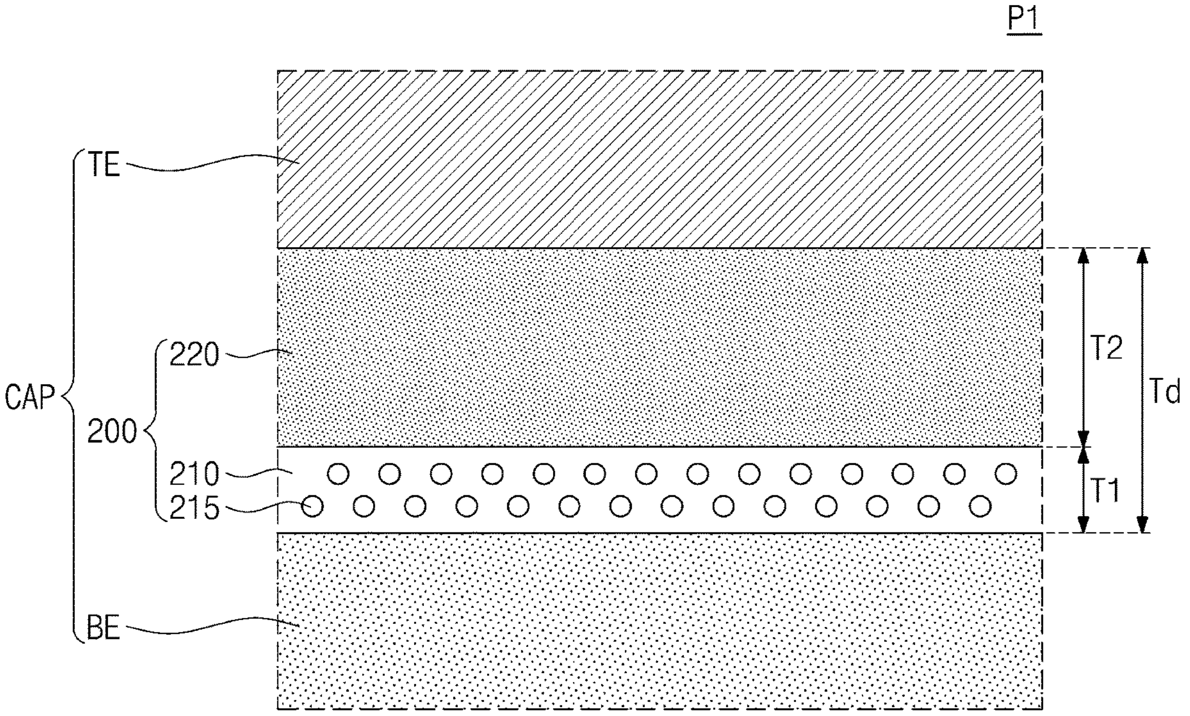
FIGS. 10 and 11 are enlarged views of portions P1 and P2, respectively, of FIG. 9.
Figure 11:
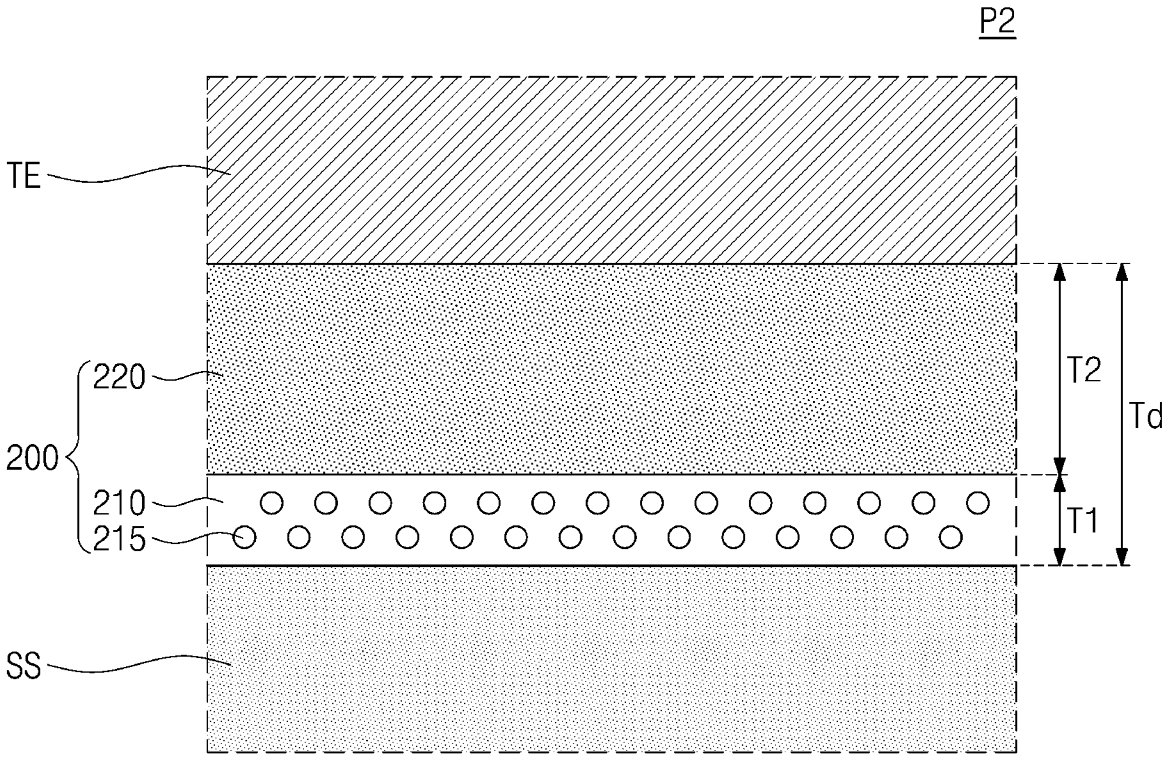

FIG. 8 is a plan view of a semiconductor device according to an embodiment of the inventive concept. FIG. 9 is a sectional view taken along a line A-A' of FIG. 8. FIGS. 10 and 11 are enlarged views of portions P1 and P2, respectively, of FIG. 9. For concise description, a previously described element may be identified by the same reference number without repeating an overlapping description thereof.

Referring to FIGS. 8 to 11, in an embodiment, a substrate 100 is provided. The substrate 100 is a semiconductor substrate. For example, the substrate 100 is one of a silicon substrate, a germanium substrate, or a silicon-germanium substrate.

An interlayer insulating layer 102 is disposed on the substrate 100. The interlayer insulating layer 102 covers at least a portion of a top surface of the substrate 100. In an embodiment, the interlayer insulating layer 102 is formed of or includes at least one of silicon nitride, silicon oxide, or silicon oxynitride. In an embodiment, the interlayer insulating layer 102 includes an empty region.

A conductive contact 104 is disposed in the interlayer insulating layer 102. In an embodiment, the conductive contact 104 is disposed in the empty region of the interlayer insulating layer 102. In an embodiment, a plurality of conductive contacts 104 are provided that are spaced apart from each other in a first direction D1 and a second direction D2 and that are parallel to the top surface of the substrate 100 and are not parallel, such as orthogonal, to each other. The conductive contact 104 is formed of or includes at least one of a doped semiconductor material, such as poly silicon, a metal-semiconductor compound, such as tungsten silicide, a conductive metal nitride, such as titanium nitride, tantalum nitride, or tungsten nitride, or a metal, such as titanium, tungsten, or tantalum. The conductive contact 104 is electrically connected to an impurity region, such as source/drain terminals, formed in the substrate 100.

An etch stop pattern 420 is disposed on the interlayer insulating layer 102. The etch stop pattern 420 covers the interlayer insulating layer 102 and exposes the conductive contacts 104. The etch stop pattern 420 is formed of or includes at least one of silicon oxide, SiCN, or SiBN.

The bottom electrode BE is disposed on the conductive contact 104. The bottom electrode BE penetrates the etch stop pattern 420 and is electrically connected to the conductive contact 104. In an embodiment, as shown in FIG. 9, the bottom electrode BE has a pillar shape. In addition, in another embodiment, the bottom electrode BE has a hollow cylinder shape with one closed end, such as a cup shape. In addition, in another embodiment, a lower portion of the bottom electrode BE has a pillar shape and an upper portion of the bottom electrode BE has a hollow cylinder shape.

A plurality of bottom electrodes BE are provided, and in an embodiment, the bottom electrodes BE are spaced apart from each other in the first and second directions D1 and D2. For example, the bottom electrodes BE are arranged in a honeycomb pattern, when viewed in a plan view. In detail, each of the bottom electrodes BE is placed at the center of a hexagon defined by six other bottom electrodes BE.

The bottom electrode BE is formed of or includes at least one conductive material. In an embodiment, the bottom electrode BE is formed of or includes at least one of silicon (Si), a metal, such as cobalt, titanium, nickel, tungsten, or molybdenum, a metal nitride, such as titanium nitride (e.g., TiN), titanium silicon nitride (e.g., TiSiN), titanium aluminum nitride (e.g., TiAlN), tantalum nitride (e.g., TaN, TaAlN), or tungsten nitride (e.g., WN), a precious metals, such as platinum (Pt), ruthenium (Ru) or iridium (Ir), a conductive oxide, such as PtO, $RuO_2$, $IrO_2$, SRO($SrRuO_3$), BSRO ((Ba,Sr)$RuO_3$), CRO ($CaRuO_3$), or LSCo, or a metal silicide.

A supporting pattern SS is provided on the substrate 100. The supporting pattern SS is provided between adjacent bottom electrodes BE. The supporting pattern SS is in contact with a side surface of the bottom electrode BE and encloses the side surface of the bottom electrode BE. The supporting pattern SS physically supports the bottom electrode BE.

In an embodiment, a plurality of supporting patterns SS are provided, and the supporting patterns SS are spaced apart from each other in a third direction D3 perpendicular to the top surface of the substrate 100 and to a plane defined by the first direction D1 and the second direction D2. The supporting patterns SS have different thicknesses from each other in the third direction D3. A top surface of the uppermost one of the supporting patterns SS may be located at a height that is different from or substantially the same as a height of the top surface of the bottom electrode BE. In an embodiment, as shown in FIG. 10, the top surface of the uppermost supporting pattern SS is located at a height that is higher than the top surface of the bottom electrode BE, but embodiments of the inventive concept are not necessarily limited to this example. In an embodiment, the supporting pattern SS is formed of or includes at least one of silicon nitride, SiBN, or SiCN.

A penetration hole PH is formed between adjacent bottom electrodes BE. For example, each of the penetration holes PH has a circular shape that is located between three adjacent bottom electrodes BE, and exposes a portion of a side surface of each of the three bottom electrodes BE. However, embodiments of the inventive concept are not necessarily limited to this example, and in an embodiment, the penetration hole PH has one of various other shapes that is located between a plurality of bottom electrodes BE. The penetration hole PH penetrates the supporting patterns SS. The penetration hole PH exposes the etch stop pattern 420. In an embodiment, a plurality of penetration holes PH are provided that are spaced apart from each other in the first and second directions D1 and D2.

The top electrode TE is provided on the bottom electrode BE. The top electrode TE covers the bottom electrode BE and the supporting pattern SS. The top electrode TE fills the penetration holes PH and spaces between the bottom electrodes BE, between the supporting patterns SS, and between the lowermost supporting pattern SS and the etch stop pattern 420. The top electrode TE is formed of or includes at least one of titanium nitride, doped polysilicon, or doped silicon germanium. The top electrode TE may have a single- or multi-layered structure.

The dielectric layer 200 is interposed between each of the bottom electrodes BE and the top electrode TE and extends into a region between the supporting pattern SS and the top electrode TE. The dielectric layer 200 conformally covers the supporting pattern SS, the bottom electrodes BE, and the etch stop pattern 420. The dielectric layer 200, along with the top electrode TE, fill the penetration holes PH. The dielectric layer 200 includes the first dielectric layer 210, the second dielectric layer 220, and the first impurity 215. The second dielectric layer 220 is stacked on the first dielectric layer 210 in a direction that is perpendicular to an interface between each of the bottom electrodes BE and the top electrode TE, and the first impurity 215 is provided in the first dielectric layer 210. The first dielectric layer 210 is formed of or includes a ferroelectric material, and the second dielectric layer 220 is formed of or includes an anti-ferroelectric material. The first impurity 215 includes a trivalent cation material.

The dielectric layer 200 has substantially the same features as the dielectric layer 200 described with reference to FIGS. 1 to 7. In an embodiment, as shown in FIGS. 1 and 10, the first dielectric layer 210 is interposed between the bottom electrode BE and the second dielectric layer 220, and the second dielectric layer 220 is interposed between the first dielectric layer 210 and the top electrode TE. The first dielectric layer 210 is in contact with the bottom electrode BE. However, embodiments of the inventive concept are not necessarily limited to this example, and in an embodiment, the dielectric layer 200 shown in FIGS. 2 to 7 can be incorporated into a memory device according to an embodiment of the inventive concept.

The first and second dielectric layers 210 and 220 of the dielectric layer 200 extend into a region between the supporting pattern SS and the top electrode TE, as shown in FIG. 11. The first impurity 215 is further provided in the first dielectric layer 210 between the supporting pattern SS and the top electrode TE. Between the supporting pattern SS and the top electrode TE, the second dielectric layer 220 is stacked on the first dielectric layer 210 in a direction that is perpendicular to an interface between the supporting pattern SS and the top electrode TE, and the first impurity 215 is provided in the first dielectric layer 210.

The dielectric layer 200 between the supporting pattern SS and the top electrode TE has substantially the same features as the dielectric layer 200 described with reference to FIGS. 1 to 7, except that the bottom electrode BE is replaced by the supporting pattern SS. In an embodiment, as shown in FIG. 11, the dielectric layer 200 has substantially the same features as the dielectric layer 200 of FIG. 1, except that the bottom electrode BE is replaced by the supporting pattern SS. For example, the first dielectric layer 210 is interposed between the supporting pattern SS and the second dielectric layer 220, and the second dielectric layer 220 is interposed between the first dielectric layer 210 and the top electrode TE. The first dielectric layer 210 is in contact with the supporting pattern SS. However, embodiments of the inventive concept are not necessarily limited to this example, and in an embodiment, the dielectric layer 200 of FIGS. 2 to 7 can be incorporated into a memory device according to an embodiment of the inventive concept.

The bottom electrode BE, the dielectric layer 200, and the top electrode TE constitute the capacitor structure CAP. For example, the capacitor structure CAP is a data storing element in a semiconductor device according to an embodiment of the inventive concept.

Figure 12:
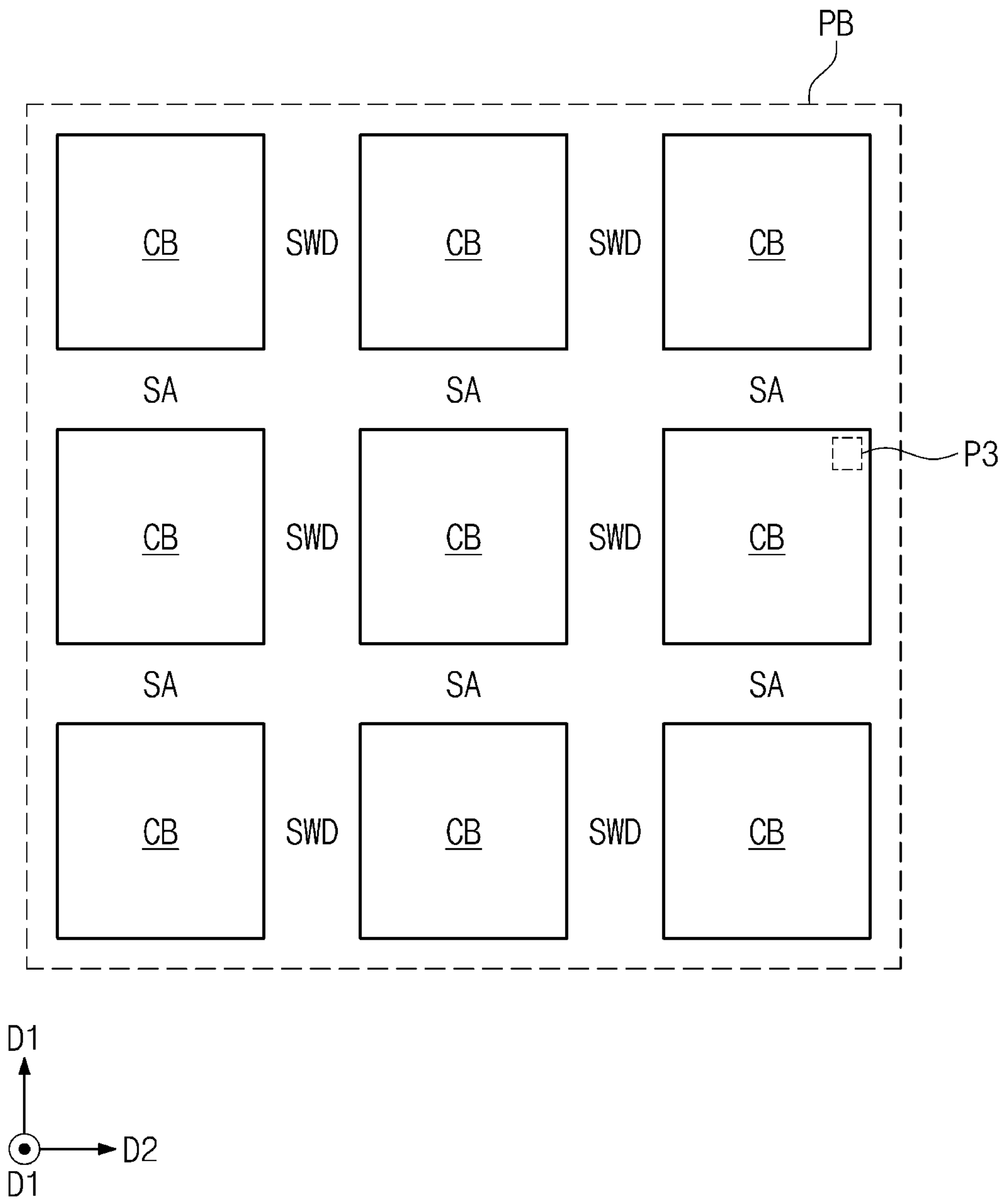
FIG. 12 is a block diagram of a semiconductor device according to an embodiment of the inventive concept.
Figure 13:
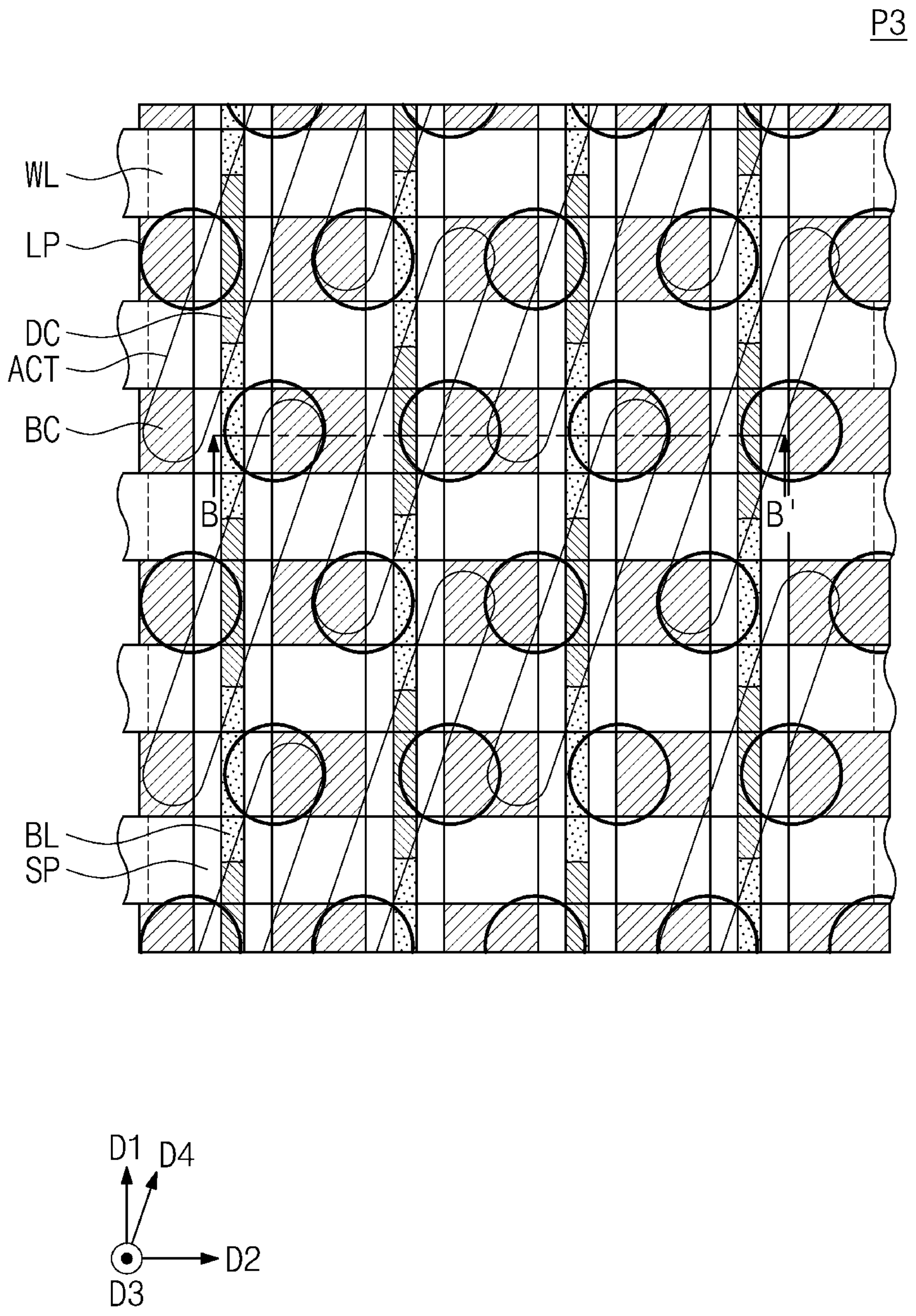
FIG. 13 is an enlarged view of a portion P3 of FIG. 12.
Figure 14:
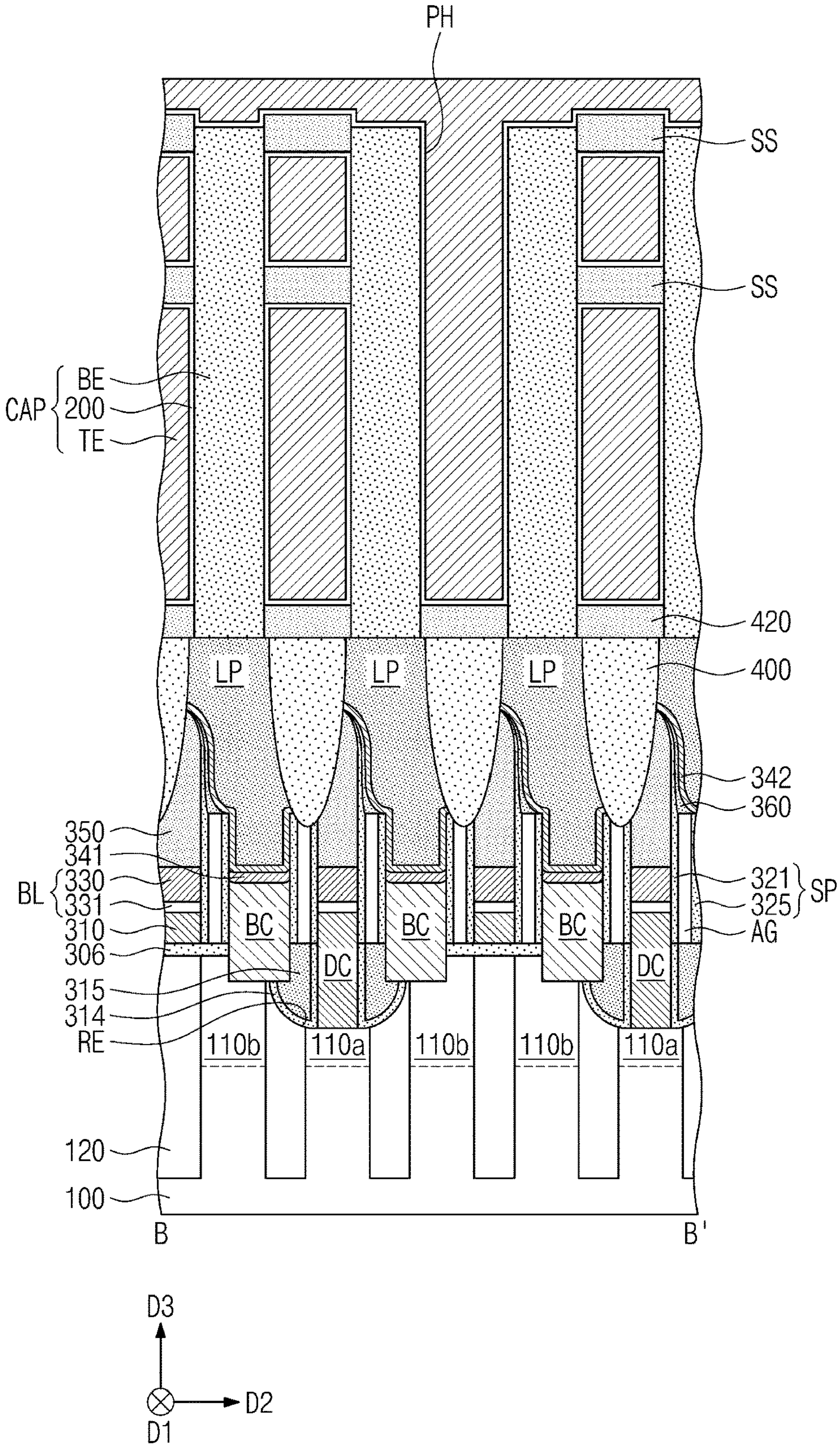
FIG. 14 is a sectional view taken along a line B-B' of FIG. 13.

FIG. 12 is a block diagram of a semiconductor device according to an embodiment of the inventive concept. FIG. 13 is an enlarged view of a portion P3 of FIG. 12. FIG. 14 is a sectional view taken along a line B-B' of FIG. 13. For concise description, a previously described element may be identified by the same reference number without repeating an overlapping description thereof.

Referring to FIG. 12, in an embodiment, a semiconductor device includes cell blocks CB and a peripheral block PB that encloses each of the cell blocks CB. The semiconductor device may be a memory device, and each of the cell blocks CB includes a cell circuit, such as a memory integrated circuit). The cell blocks CB are spaced apart from each other in the first and second directions D1 and D2.

The peripheral block PB includes various peripheral circuits that are used to operate the cell circuit, and the peripheral circuits are electrically connected to the cell circuit. The peripheral block PB includes sense amplifier circuits SA and sub-word line driver circuits SWD. In an embodiment, the sense amplifier circuits SA face each other with the cell blocks CB interposed therebetween, and the sub-word line driver circuits SWD face each other with the cell blocks CB interposed therebetween. The peripheral block PB further includes power and ground circuits that drive a sense amplifier, but embodiments of the inventive concept are not necessarily limited to this example.

Referring to FIGS. 13 and 14, in an embodiment, the substrate 100 includes a cell region. The cell region is a region of the substrate 100, in which each cell block CB of FIG. 12 is provided. The substrate 100 is one of a silicon substrate, a germanium substrate, or a silicon-germanium substrate.

Active patterns ACT are disposed on the cell region of the substrate 100. When viewed in a plan view, the active patterns ACT are spaced apart from each other in the first and second directions D1 and D2. In an embodiment, the active patterns ACT have a bar-shaped pattern that extends in a fourth direction D4 that is parallel to the top surface of the substrate 100 but not parallel to the first and second directions D1 and D2. An end portion of one of the active patterns ACT is located near a center of another active pattern ACT adjacent thereto in the second direction D2. Each of the active patterns ACT is a protruding portion of the substrate 100 that extends from the substrate 100 in the third direction D3.

Device isolation layers 120 are disposed in the substrate 100 between the active patterns ACT. The device isolation layers 120 define the active patterns ACT. In an embodiment, the device isolation layers 120 is formed of or includes at least one of silicon oxide, silicon nitride, and/or silicon oxynitride.

Word lines WL are disposed in the substrate 100 and cross the active patterns ACT and the device isolation layers 120. The word lines WL are disposed in grooves that are formed in the active patterns ACT and the device isolation layers 120. The word lines WL extend in the second direction D2 and are spaced apart from each other in the first direction D1. The word lines WL are buried in the substrate 100.

Impurity regions 110*a* and 110*b* are provided in the active patterns ACT. The impurity regions 110*a* and 110*b* include first impurity regions 110*a* and second impurity regions 110*b*. The second impurity regions 110*b* are respectively provided at opposite ends of each of the active patterns ACT. Each of the first impurity regions 110*a* is formed in a portion between the second impurity regions 110*b* of a corresponding active pattern ACT. The first and second impurity regions 110*a* and 110*b* contain impurities of the same conductivity type, such as n-type.

A buffer pattern 306 is disposed on the cell region of the substrate 100. The buffer pattern 306 covers the active patterns ACT, the device isolation layers 120, and the word lines WL. In an embodiment, the buffer pattern 306 is formed of or includes at least one of silicon oxide, silicon nitride, and/or silicon oxynitride.

Bit lines BL are disposed on the substrate 100. The bit lines BL extend in the first direction D1 and are spaced apart from each other in the second direction D2. Each of the bit lines BL includes a first ohmic pattern 331 and a metal-containing pattern 330 that are sequentially stacked. In an embodiment, the first ohmic pattern 331 is formed of or includes metal silicide. In an embodiment, the metal-containing pattern 330 is formed of or includes at least one metal, such as tungsten, titanium, or tantalum.

Polysilicon patterns 310 are interposed between the bit lines BL and the buffer pattern 306.

Bit line contacts DC are respectively interposed between the bit lines BL and the first impurity regions 110*a*. The bit lines BL are electrically connected to the first impurity regions 110*a* by the bit line contacts DC. The bit line contacts DC are formed of or include doped or undoped polysilicon.

The bit line contacts DC are disposed in recess regions RE. The recess region RE are formed in upper portions of the first impurity regions 110*a* and the device isolation layers 120 that are adjacent to each other. A first gapfill insulating pattern 314 and a second gapfill insulating pattern 315 fill a remaining portion of the recess region RE.

A bit line capping pattern 350 is provided on each of the bit lines BL and extends in the first direction D1. In an embodiment, the bit line capping pattern 350 is formed of or includes silicon nitride.

A bit line spacer SP is disposed that covers a side surface of each of the polysilicon patterns 310, an upper side surface of each of the bit line contacts DC, a side surface of each of the bit lines BL, and a side surface of the bit line capping pattern 350. The bit line spacer SP extends along each of the bit lines BL or in the first direction D1.

The bit line spacer SP includes a first sub-spacer 321 and a second sub-spacer 325 that are spaced apart from each other. In an embodiment, the first and second sub-spacers 321 and 325 are spaced apart from each other by an air gap AG. The first sub-spacer 321 is in contact with the side surface of each of the bit lines BL and covers the side surface of the bit line capping pattern 350. The second sub-spacer 325 is provided along a side surface of the first sub-spacer 321. The first and second sub-spacers 321 and 325 are formed of or include at least one of silicon nitride, silicon oxide, or silicon oxynitride, and may have a single- or multi-layered structure. The first and second sub-spacers 321 and 325 are formed of or include the same material.

An upper spacer 360 covers the side surface of the first sub-spacer 321 and extends to a region on a top surface of the second sub-spacer 325. The upper spacer 360 covers or stops the air gap AG.

Storage node contacts BC are disposed on the substrate 100 and are interposed between adjacent ones of the bit lines BL. The bit line spacer SP is interposed between the storage node contacts BC and the bit lines BL adjacent thereto. The storage node contacts BC are spaced apart from each other in the first and second directions D1 and D2. Each of the storage node contacts BC is electrically connected to a corresponding second impurity region 110*b*. The storage node contacts BC are formed of or include doped or undoped polysilicon.

Second ohmic patterns 341 are disposed on the storage node contacts BC. The second ohmic pattern 341 are formed of or include at least one of a metal silicide.

A diffusion-prevention pattern 342 is disposed that conformally covers the second ohmic pattern 341, the bit line spacer SP, and the bit line capping pattern 350. The diffusion-prevention pattern 342 is formed of or includes at least one metal nitride, such as titanium nitride or tantalum nitride. The second ohmic pattern 341 is interposed between the diffusion-prevention pattern 342 and each of the storage node contacts BC.

Landing pads LP are disposed on the storage node contacts BC. Each of the landing pads LP is electrically connected to a corresponding storage node contacts BC. The landing pads LP are formed of or include at least one of a metal, such as tungsten. An upper portion of the landing pad LP is displaced from the storage node contact BC in the second direction D2. When viewed in a plan view, the landing pads LP are spaced apart from each other in the first and second directions D1 and D2. For example, the landing pads LP are spaced apart from each other in the first and second directions D1 and D2 or are arranged in a zigzag pattern. Each of the landing pads LP corresponds to one of the conductive contacts 104 of FIG. 9.

A filling pattern 400 is disposed that encloses each of the landing pads LP. The filling pattern 400 is interposed between adjacent landing pads LP. In an embodiment, the filling pattern 400 is formed of or includes at least one of silicon nitride, silicon oxide, or silicon oxynitride. In an embodiment, the filling pattern 400 includes an empty region. The filling pattern 400 corresponds to the interlayer insulating layer 102 of FIG. 9.

The etch stop pattern 420 is disposed on the filling pattern 400. The etch stop pattern 420 exposes top surfaces of the landing pads LP.

The bottom electrode BE is disposed on the landing pads LP. In an embodiment, a plurality of bottom electrodes BE are provided, and each of the bottom electrodes BE is disposed on a corresponding landing pad LP. The bottom electrode BE is electrically connected to the corresponding landing pad LP.

The supporting pattern SS is disposed on the substrate 100. The supporting pattern SS is interposed between adjacent bottom electrodes BE. The supporting pattern SS corresponds to the supporting pattern SS described with reference to FIGS. 8 to 11.

The top electrode TE covers the bottom electrode BE and the supporting pattern SS. The dielectric layer 200 is interposed between the bottom electrode BE and the top electrode TE and extends into a region between the supporting pattern SS and the top electrode TE. The bottom electrode BE, the dielectric layer 200, and the top electrode TE constitute the capacitor structure CAP. The capacitor structure CAP corresponds to the capacitor structure CAP of a semiconductor device described above. For example, the bottom electrode BE, the dielectric layer 200, and the top electrode TE have the same features as those of a previous embodiment.

According to an embodiment of the inventive concept, a dielectric layer of a capacitor structure includes a first dielectric layer that includes a ferroelectric material, a second dielectric layer that includes an anti-ferroelectric material, and a first impurity provided in the first dielectric layer. Dipoles in the dielectric layer are easily aligned by the first impurity. Accordingly, a dielectric constant of a dielectric layer is increased, and an electrostatic capacitance of the capacitor structure is increased.

While embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:

a capacitor structure, wherein the capacitor structure comprises a bottom electrode, a dielectric layer, and a top electrode that are stacked in a first direction, the dielectric layer comprises a first dielectric layer, a second dielectric layer stacked on the first dielectric layer in the first direction, a first impurity provided in the first dielectric layer, and a second impurity provided in the second dielectric layer, the first dielectric layer comprises a ferroelectric material, the second dielectric layer comprises an anti-ferroelectric material, and wherein the second impurity is located at a specific height in the first direction that is between an upper surface and a lower surface of the second dielectric layer, and the specific height is near half of a total height of the second dielectric layer.

2. The semiconductor device of claim 1, wherein the first impurity comprises a trivalent cation material.

3. The semiconductor device of claim 1, wherein a total thickness in the first direction of the dielectric layer is less than or equal to 60 Å.

4. The semiconductor device of claim 1, wherein a thickness in the first direction of the first dielectric layer is less than or equal to 10 Å.

5. The semiconductor device of claim 1, wherein a thickness in the first direction of the first dielectric layer is less than a thickness in the first direction of the second dielectric layer.

6. The semiconductor device of claim 1, wherein a thickness in the first direction of the first dielectric layer is less than or equal to 30% of a total thickness in the first direction of the dielectric layer.

7. The semiconductor device of claim 1, wherein the second dielectric layer includes a plurality of second dielectric layers, and the first dielectric layer is interposed between two second dielectric layers that are adjacent to each other in the first direction.

8. The semiconductor device of claim 1, wherein the first dielectric layer includes a plurality of first dielectric layers, the second dielectric layer includes a plurality of second dielectric layers, the first dielectric layers and the second dielectric layers are alternately stacked in the first direction, and the first impurity is provided in at least one of the first dielectric layers.

9. The semiconductor device of claim 8, wherein a thickness in the first direction of each of the first dielectric layers is less than or equal to 10 Å.

10. The semiconductor device of claim 8, wherein a sum of the thicknesses of the first dielectric layers is less than or equal to 30% of a total thickness of the dielectric layer in the first direction.

11. The semiconductor device of claim 1, wherein the second impurity comprises a material that has a band gap greater than or equal to 5 eV.

12. A semiconductor device, comprising:

a capacitor structure, wherein the capacitor structure comprises a bottom electrode, a dielectric layer, and a top electrode that are sequentially stacked in a first direction, the dielectric layer comprises a first dielectric layer, a second dielectric layer stacked on the first dielectric layer in the first direction, a first impurity provided in the first dielectric layer, and a second impurity provided in the second dielectric layer, the second impurity is located at a specific height in the first direction that is between an upper surface and a lower surface of the second dielectric layer near half of a total height of the second dielectric layer, and the first dielectric layer is in contact with the bottom electrode or the top electrode.

13. The semiconductor device of claim 12, wherein the first dielectric layer comprises a ferroelectric material, and the second dielectric layer comprises an anti-ferroelectric material.

14. The semiconductor device of claim 12, wherein the first impurity comprises a trivalent cation material.

15. The semiconductor device of claim 12, wherein the first dielectric layer includes a plurality of first dielectric layers, the second dielectric layer includes a plurality of second dielectric layers, the first dielectric layers and the second dielectric layers are alternately stacked in the first direction, and a lowermost first dielectric layer is in contact with the bottom electrode or an uppermost first dielectric layer is in contact with the top electrode.

16. A semiconductor device, comprising:

a substrate;

bottom electrodes disposed on the substrate and that are horizontally spaced apart from each other;

a top electrode that covers the bottom electrodes; and a dielectric layer interposed between each of the bottom electrodes and the top electrode, wherein the dielectric layer comprises a first dielectric layer, a second dielectric layer stacked on the first dielectric layer in a first direction perpendicular to an interface between each of the bottom electrodes and the top electrode, and a first impurity provided in the first dielectric layer, a second impurity provided in the second dielectric layer, the first dielectric layer comprises a ferroelectric material, the second dielectric layer comprises an anti-ferroelectric material, and the second impurity is located at a specific height in the first direction that is between an upper surface and a lower surface of the second dielectric layer near half of a total height of the second dielectric layer.

17. The semiconductor device of claim 16, wherein the first impurity comprises a trivalent cation material.

18. The semiconductor device of claim 16, wherein the first dielectric layer is in contact with one of the bottom electrodes or the top electrode.

19. The semiconductor device of claim 16, further comprising:

a supporting pattern interposed between the bottom electrodes, wherein the first and second dielectric layers of the dielectric layer extend into a region between the supporting pattern and the top electrode, and the first impurity is further provided in the first dielectric layer between the supporting pattern and the top electrode.

* * * * *